(12) United States Patent  
Kosel et al.

(10) Patent No.: US 10,379,175 B2  
(45) Date of Patent: Aug. 13, 2019

(54) LOW-NOISE MAGNETIC SENSORS

(71) Applicant: King Abdullah University of Science and Technology, Thuwal (SA)

(72) Inventors: Jurgen Kosel, Thuwal (SA); Jian Sun, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 14/097,332

(22) Filed: Dec. 5, 2013

(65) Prior Publication Data

US 2014/0084913 A1    Mar. 27, 2014  
US 2017/0038439 A9    Feb. 9, 2017

Related U.S. Application Data

(63) Continuation-in-part of application No. 13/187,329, filed on Jul. 20, 2011, now Pat. No. 9,164,153.  
(Continued)

(51) Int. Cl.  
*G01R 33/09*      (2006.01)  
*G01R 33/07*      (2006.01)  
(Continued)

(52) U.S. Cl.  
CPC ....... *G01R 33/095* (2013.01); *G01R 33/0052* (2013.01); *G01R 33/07* (2013.01); *G01R 33/072* (2013.01); *H01L 43/02* (2013.01)

(58) Field of Classification Search  
USPC .......................................... 257/425; 324/251  
See application file for complete search history.

(56) References Cited

U.S. PATENT DOCUMENTS 3,835,376 A * 9/1974 Kataoka ........................ 324/252  
7,082,838 B2 * 8/2006 Rowe et al. ................... 73/777  
(Continued)

OTHER PUBLICATIONS

"Hall effect enhanced low-field sensisitivity in a three-contact extraordinary magnetoresistance sensor;" Sun et al., Applied Physics Letters 100, 232407 (2012), published online Jun. 6, 2012.*  
(Continued)

*Primary Examiner* — Robert K Carpenter  
(74) *Attorney, Agent, or Firm* — Patent Portfolio Builders, PLLC

(57) ABSTRACT

Magnetic sensors are disclosed, as well as methods for fabricating and using the same. In some embodiments, an EMR effect sensor includes a semiconductor layer. In some embodiments, the EMR effect sensor may include a conductive layer substantially coupled to the semiconductor layer. In some embodiments, the EMR effect sensor may include a voltage lead coupled to the conductive layer. In some embodiments, the voltage lead may be configured to provide a voltage for measurement by a voltage measurement circuit. In some embodiments, the EMR effect sensor may include a second voltage lead coupled to the semiconductor layer. In some embodiments, the second voltage lead may be configured to provide a voltage for measurement by a voltage measurement circuit. Embodiments of a Hall effect sensor having the same or similar structure are also disclosed.

17 Claims, 15 Drawing Sheets

Related U.S. Application Data

(60) Provisional application No. 61/365,914, filed on Jul. 20, 2010, provisional application No. 61/733,973, filed on Dec. 6, 2012.

(51) Int. Cl.
  *H01L 43/02* (2006.01)
  *G01R 33/00* (2006.01)

(56) References Cited

U.S. PATENT DOCUMENTS

| | | | |
|---|---|---|---|
| 7,203,036 B2 | 4/2007 | Chattopadhyay et al. | |
| 7,466,521 B2 | 12/2008 | Boone, Jr. et al. | |
| 7,502,206 B2 | 3/2009 | Gurney et al. | |
| 7,508,635 B2 | 3/2009 | Boone, Jr. et al. | |
| 7,881,020 B2 | 2/2011 | Boone, Jr. et al. | |
| 2008/0088982 A1* | 4/2008 | Folks et al. | 360/324 |
| 2009/0326337 A1 | 12/2009 | Solin et al. | |
| 2010/0261304 A1 | 10/2010 | Chang et al. | |
| 2011/0233382 A1* | 9/2011 | Solin | H01L 27/14665 250/208.1 |

OTHER PUBLICATIONS

PCT International Search Report and Written Opinion issued in PCT Application No. PCT/IB2011/002444, dated Oct. 2, 2012.

Boone et al., "Mesoscopic EMR Device Magnetic Sensitivity in I-V-I-V Configuration" IEEE Electron Device Lett. 30, Feb. 2009, 117.

Hewett and Kusmartsev, "Geometrically enhanced extraordinary magnetoresistance in semiconductor-metal hybrids," Phys. Rev. B, 82, Dec. 2010,212404.

Hoener et al., "Geometry-enhanced magnetoresistance of narrow Au/InAs hybrid structures incorporating a two-dimensional electron system," J. Appl. Phys. 99, Feb. 2006, 036102.

Holz et al., "Optimization of semiconductor-metal hybrid structures for application in magnetic-field sensors and read heads," Appl. Phys. Lett. 83, Oct. 2003, pp. 3344-3346.

Moussa et al., "Finite-element modeling of extraordinary magnetoresistance in thin film semiconductors with metallic inclusions," Phys. Rev. B, 64, Oct. 2001, 184410.

PCT Invitation to Pay Additional Fees and Partial International Search Report issued in International application No. PCT/IB2011-002444, dated Mar. 7, 2012.

Solin et al., "Enhanced room-temperature geometric magnetoresistance in inhomogeneous narrow-gap semiconductors," Science, 289, Sep. 2000, pp. 1530-1532.

Solin et al., "Nanoscopic magnetic field sensor based on extraordinary magnetoresistance," J.Vac. Sci. Technol. B, 21 (6), Dec. 2003, pp. 3002-3006.

Zhou et al., "Extraordinary magnetoresistance in externally shunted van der Pauw plates," App. Phys. Lett., 78(5), Jan. 2001, pp. 667-669.

Solin et al., "Nonmagnetic semiconductors as read-head sensors for ultra-high-density magnetic recording," Applied Physics Letters, vol. 80. No. 21, May 2002.

\* cited by examiner

A)

B)

LOW-NOISE MAGNETIC SENSORS

CROSS-REFERENCE TO RELATED APPLICATIONS

This application is a continuation-in-part (CIP) to U.S. patent application Ser. No. 13/187,329 filed on Jul. 20, 2011, and claims priority to U.S. Provisional Application No. 61/733,973 filed Dec. 6, 2012, the entire contents of which are specifically incorporated herein by reference.

BACKGROUND OF THE INVENTION

Field of the Invention

The present invention relates generally to magnetic sensors, more particularly, to extraordinary magnetoresistance (EMR) effect and Hall effect sensors and methods for making and using the same.

Description of the Related Art

Generally, there are at least two types of magnetic sensors that can be used to measure a magnetic field, including an EMR sensor and a Hall sensor. An EMR sensor operates based on an EMR effect. Broadly speaking, the EMR effect quantifies scattering of electrons at a material interface when an electric current is applied to the material. The scattering occurs due to an interaction between the magnetic field and electrons in at least one of the materials comprising the sensor. Generally, a the Hall effect quantifies a shearing force caused by interaction between the magnetic field and electrons in the current applied to the material. Each of these effects are described in greater detail in the sections below.

EMR Effect Sensors

EMR is a large magnetoresistance effect that may arise in a nonmagnetic semiconductor metal hybrid structure. In an EMR effect sensor, the Lorentz force induced by a magnetic field may cause a redistribution of the electric current density between adjacent semiconductor and metal layers resulting in resistance changes. The EMR effect may be described by equation (1):

$$EMR(H_e) = \frac{R(H) - R(0)}{R(0)} \quad (1)$$

where $H_e$ is the external magnetic field (e.g., external to the sensor), R(H) is the measured resistance of the sensor in the presence of a magnetic field H, and R(0) is the measured resistance of the sensor at zero magnetic field.

The dimensions of an EMR sensor, the thickness of its layers, and the placement of the voltage and current leads may significantly effect magnitude of the measured EMR. FIG. 1A and FIG. 1B depict prior art EMR effect sensors 100A and 100B. As depicted in both figures, EMR effect sensors 100A and 100B each have a metal layer 102 and a semiconductor layer 104. In both pictures, the voltage and current leads are arranged symmetrically around center 110 of the EMR effect sensor.

Voltage leads 106 and current leads 108 are located on one side of the device coupled to semiconductor layer 104. FIG. 1A depicts voltage leads 106 and current leads 108 in an V-I-I-V formation, and FIG. 1B depicts the voltage and current in a I-V-V-I formation. The voltage (V) between voltage leads 106 and the current (I) through current leads 108 allow for the calculation of the resistance R(H) in equation (1) by using equation (2):

$$R(H) = \frac{V(H)}{I(H)} \quad (2)$$

EMR effect sensors 100A and 100B can further be described by width 112 of the metal layer 102, width 114 of the semiconductor layer 104, and length 116 of the EMR effect sensor. FIG. 2 illustrates the simulated EMR effect for EMR effect sensor 100B (e.g., having an I-V-V-I lead formation) for four different magnetic fields as a function of the length (L) 116 of the EMR sensor divided by the width ($W_s$) 114 of the semiconductor layer 104. In this example, metal layer 102 is gold, and semiconductor layer 104 is indium antimonide. As shown, the EMR effect is dependent on the dimensions of the sensor. In FIG. 2, the EMR effect reaches a maximum of approximately $1.1 \times 10^5 \%$ with a 1 T magnetic field and an $L/W_s$ ratio of 25.

FIG. 3A and FIG. 3B illustrate the change in current density in semiconductor layer 104 of EMR effect sensor 100B. At a zero magnetic field, the current density in semiconductor layer 104 is low, as depicted by minimal current density flux lines in semiconductor layer 104 in FIG. 3A. The presence of an external magnetic field causes a redistribution of the current density due to the Lorentz force yielding an increased current density in the semiconductor, as depicted by more current density flux lines in semiconductor layer 104 in FIG. 3B. In this example, a 0.3 T external magnetic field creates an increased current density within the semiconductor layer, and as a result, creates a higher electrical resistivity.

Hall Effect Sensors

The Hall effect is the production of a voltage difference (the Hall voltage) across an electrical conductor, transverse to an electric current in the conductor and a magnetic field perpendicular to the current. For an n-type semiconductor where there is a dominate type of charge carrier-electron, the Hall voltage $V_H$ is given by equation (3):

$$V_H = -\frac{IB}{ned} \quad (3)$$

where I is the current input, B is the magnetic flux density, d is the thickness of the plate, e is the electron charge, and n is the carrier density of electrons.

The most frequently used Hall effect sensor consists of a high mobility semiconductor conductive bar with four or six contacts. Two of the contacts are current leads, which are used to induce a current flow through the Hall bar, and the other contacts are voltage probes which are used to measure the Hall voltage. FIG. 9 depicts the typical four contacts Hall effect sensor 900. As depicted in the figure, Hall effect sensors 900 have a semiconductor bar 901 and voltage probes 902 and current leads 903 are located on the edges of the semiconductor bar 901. The voltage probes are arranged symmetrically along the centerline 904 of the Hall sensor.

The Hall sensitivity $S_H$ is a very useful parameter for judging the performance of the Hall sensor (equation (4)).

$$S_H = \frac{\partial V_H}{\partial B} = -\frac{I}{ned} \quad (4)$$

The Hall sensitivity is typically 1~5 mV/mT for a 1 mA current with the commercial Hall sensors.

Another useful parameter is the thermal field noise (in T/√Hz, equation (5)):

$$\sqrt{S_B} = \sqrt{\frac{4K_B TR}{S_H}} \quad (5)$$

where R is the resistance of the Hall sensor, T is the temperature and $K_B$ is the Boltzmann constant. Two-dimensional quantum-well multilayer heterostructures based on GaAs are promising for low-noise Hall sensors with 100 nT/√Hz. In general, noise could be significantly reduced with devices of lower resistance.

SUMMARY OF THE INVENTION

Embodiments of magnetic sensors are disclosed. In one embodiment, the magnetic sensor includes a semiconductor layer. In some embodiments, the sensor may include a conductive layer substantially coupled to the semiconductor layer. In some embodiments, the sensor may include a first voltage lead coupled to the semiconductor layer. In some embodiments, the first voltage lead may be configured to provide a voltage for measurement by a voltage measurement circuit. In some embodiments, the sensor may include a second voltage lead coupled to the conductive layer. In some embodiments, the second voltage lead may be configured to provide a voltage for measurement by a voltage measurement circuit.

EMR Sensors

Extraordinary magnetoresistance (EMR) effect sensors are disclosed. In some embodiments, the EMR effect sensor includes a semiconductor layer. In some embodiments, the EMR effect sensor may include a conductive layer substantially coupled to the semiconductor layer. In some embodiments, the EMR effect sensor may include a first voltage lead coupled to the semiconductor layer. In some embodiments, the first voltage lead may be configured to provide a voltage for measurement by a voltage measurement circuit. In some embodiments, the EMR effect sensor may include a second voltage lead coupled to the conductive layer. In some embodiments, the second voltage lead may be configured to provide a voltage for measurement by a voltage measurement circuit.

In some embodiments, the EMR effect sensor may include a first current lead coupled to the semiconductor layer. In some embodiments, the first current lead may be configured to provide a current for measurement by a current measurement circuit. In some embodiments, the EMR effect sensor may include a second current lead. The second current lead may be coupled to the semiconductor layer. In some embodiments, the second current lead may be configured to provide a current for measurement by a current measurement circuit.

In some embodiments, the conductive layer may include gold (Au). In some embodiments, the conductive layer may include copper (Cu). In some embodiments, the conductive layer may include silver (Ag). In some embodiments, the conductive layer may include Titanium (Ti).

In some embodiments, the semiconductor layer may include indium antimonide (InSb). In some embodiments, the semiconductor layer may include indium arsenide (InAs). In some embodiments, the semiconductor layer may include gallium asrsenide (GaAs). In some embodiments, the semiconductor layer may include aluminum indium antimonide (AlInSb). In some embodiments, the semiconductor layer may include aluminum indium arsenide (AlInAs). In some embodiments, the semiconductor layer may include silicon (Si).

In some embodiments, the semiconductor layer is n-doped. In some embodiments, the semiconductor layer may include a first n-doped layer, a second n-doped layer, and a third n-doped layer. In some embodiments, the first n-doped layer, the second n-dope layer, and the third n-doped layer may be doped with tellurium. In some embodiments, the third n-doped layer is above the second n-doped layer and the second n-doped layer is above the first n-doped layer.

Methods for fabricating an EMR effect sensor are disclosed. In some embodiments, the method may include forming an insulation layer on a substrate. In some embodiments, the method may include forming a semiconductor layer above the insulation layer. In some embodiments, the method may include forming capping layer on the semiconductor layer. In some embodiments, the method may include forming a conductive layer coupled to the semiconductor layer. In some embodiments, the method may include forming a first voltage lead coupled to the semiconductor layer, the first voltage lead configured to provide voltage for measurement by a voltage measuring circuit. In some embodiments, the method may include forming a second voltage lead coupled to the conductive layer. In some embodiments, the second voltage lead may be configured to provide voltage for measurement by a voltage measuring circuit.

In some embodiments of the method, the method may include forming a first current lead coupled to the semiconductor layer. In some embodiments, the first current lead may be configured to provide current for measurement by a current measuring circuit. In some embodiments, the method may include forming a second current lead coupled to the semiconductor layer. In some embodiments, the second current lead may be configured to provide current for measurement by a current measuring circuit.

In some embodiments of the method, the conductive layer may include Au. In some embodiments of the method, the conductive layer may include Cu. In some embodiments of the method, the conductive layer may include Ag.

In some embodiments of the method, the semiconductor layer may include InSb. In some embodiments of the method, the semiconductor layer may include InAs. In some embodiments of the method, the semiconductor layer may include GaAs. In some embodiments of the method, the semiconductor layer may include AlInSb. In some embodiments of the method, the semiconductor layer may include AlInAs. In some embodiments of the method, the semiconductor layer may include Si.

In some embodiments of the method, the semiconductor layer is n-doped. In some embodiments of the method forming the semiconductor layer further may include forming a first n-doped layer; forming a second n-doped layer; and forming a third n-doped layer. In some embodiments of the method, forming the first n-doped layer, the second n-dope layer, and the third n-doped layer may include doping with tellurium. In some embodiments of the method, the third n-doped layer is formed above the second n-doped layer and the second n-doped layer is formed above the first n-doped layer.

Some embodiments of the method may include forming a buffer layer on top of the insulation layer and before forming the semiconductor.

In some embodiments of the method, the insulator layer may include aluminum oxide ($Al_2O_3$). In some embodiments of the method, the substrate may include GaAs.

In some embodiments of the method, the capping layer may include silicon nitride ($Si_3N_4$) and $Al_2O_3$.

Methods for detecting magnetic field are disclosed. In some embodiments, the method includes providing a EMR effect sensor. The EMR effect sensor, in some embodiments, may include a semiconductor layer, a conductive layer substantially coupled to the semiconductor layer, a first voltage lead coupled to the semiconductor layer, a second voltage lead coupled to the conductive layer, a first current lead coupled to the semiconductor layer, and a second current lead coupled to the semiconductor layer, the second current lead configured to provide current for measurement by a current measurement circuit. In some embodiments, the method may also include measuring the voltage across the first voltage lead and the second voltage lead. In some embodiments, the method may include measuring the current through the first current lead and the second current lead. In some embodiments, the method may include calculating resistance in response to the measured voltage and the measured current.

Hall Effect Sensor

A low-noise Hall sensor is disclosed. It comprises a conductive high mobility semiconductor layer with two current leads contacted to the two ends of one side along the semiconductor layer. The first voltage probe is placed on the center of one edge of the bar; the second voltage probe is a shunt-like electrode, which is coupled to the bar.

The output resistance of the low-noise Hall sensor is reduced significantly compared to the conventional Hall sensor. Due to the high conductivity of the metal, the current induced will flow into the shunt-like electrode at zero field, which acts like a short circuit in parallel to the semiconductor layer. This lowers the resistance of the device and causes a decrease of the noise level. When an external field is applied, the current flow will be deflected by the Lorentz force, which will cause the voltage difference at two voltage probes.

N-type III-V semiconductors are typically used as the conductive bar in Hall sensor because of their high electron mobility. In some embodiments, the semiconductor layer may include n-type indium antimonide (InSb). In some embodiments, the semiconductor layer may include n-type indium arsenide (InAs). In some embodiments, the semiconductor layer may include an n-type two-dimensional electron gas (2DEG) heterostructure, which is a high-mobility quantum well. A typical 2DEG is formed of a InAs/AlSb sandwich structure. Those materials are typically grown with molecular beam epitaxy (MBE).

The metallic contacts need to be ohmic. For n-type InAs and InSb, the metallic ohmic contact is typically formed with titanium (Ti)/platinum (Pt)/gold (Au) by e-beam evaporation or sputtering. For an InAs/AlSb 2DEG heterostructure, the metallic contact is typically formed with palladium (Pd)/platinum (Pt)/gold (Au) by e-beam evaporation or sputtering. Both of these two metallic structures need a post-annealing process to form the ohmic contact.

Methods for fabricating a Hall sensor are disclosed. Grow the semiconductor layer with MBE on a semi-insulating substrate, which could be gallium arsenide (GaAs). Pattern the conductive bar with conventional photo-lithography for micro-scale device and E-beam lithography for nano-scale device; the bar could be defined with wet etching method in hydrogen fluoride solution or with dry etching method using reactive ion etcher with a $BCl_3/Cl_2$ etchant gas. The metallic layer is deposited with e-beam evaporation or sputtering. The patterns of the contact could be defined with lift-off or etching process. A capping layer of silicon nitride ($SiN_x$) is deposit with plasma-enhanced chemical vapor deposition (PECVD) to protect the device from corrosion. Finally, the contact windows are opened for wire bonding.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a device or method that "comprises," "has," "includes" or "contains" one or more elements or steps possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers.

DETAILED DESCRIPTION

The present embodiments describe an advantageous structure that may be useful for sensing magnetic fields. Advantageously, the same or similar structure may be used for both an EMR sensor and a Hall Effect sensor. For example, embodiments of a semiconductor/metal hybrid structure, which comprises a conductive semiconductor layer and a metallic shunt are described. Another advantage of this structure may be the low-noise performance characteristics achieved through use of the hybrid metallic shunt structure, which may reduce the output resistance of the sensor.

In one embodiment, the magnetic sensor includes a semiconductor layer. In some embodiments, the sensor may include a conductive layer substantially coupled to the semiconductor layer. In some embodiments, the sensor may include a first voltage lead coupled to the semiconductor layer. In some embodiments, the first voltage lead may be configured to provide a voltage for measurement by a voltage measurement circuit. In some embodiments, the sensor may include a second voltage lead coupled to the conductive layer. In some embodiments, the second voltage lead may be configured to provide a voltage for measurement by a voltage measurement circuit. As will become clear in the description below, such a structure may be used as either an EMR sensor, a Hall effect sensor, or both.

EMR Effect Sensors

Figure 1:
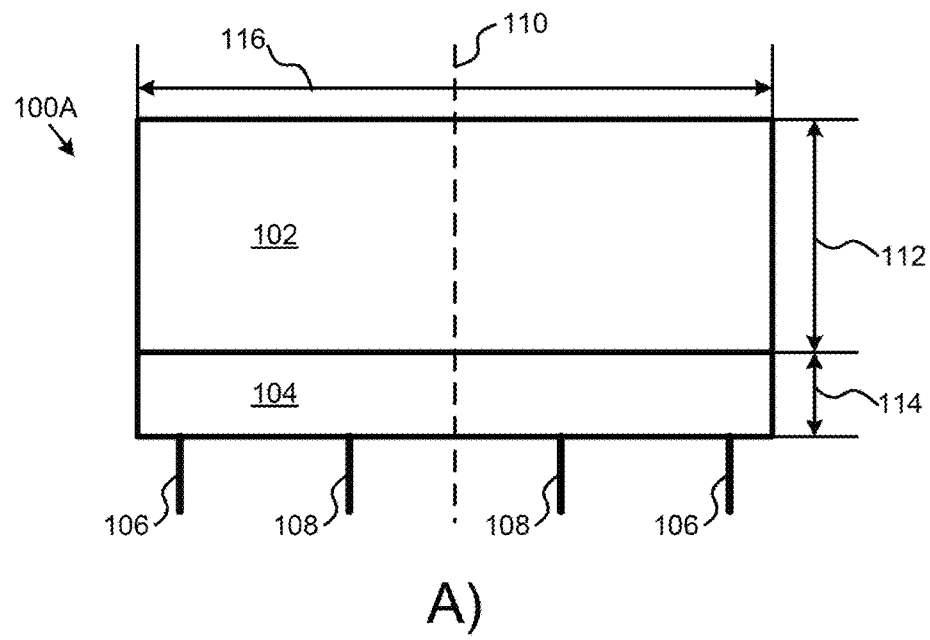
FIG. 1A illustrates a prior art EMR effect sensor with voltage and current leads in a V-I-I-V formation along one side of the sensor.
FIG. 1B illustrates a prior art EMR effect sensor with voltage and current leads in an I-V-V-I formation along one side of the sensor.
Figure 1:
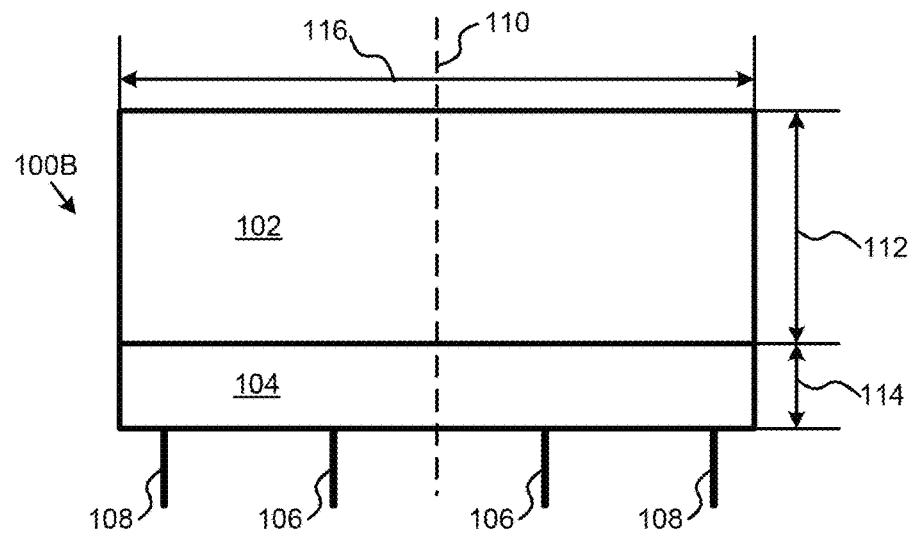
Figure 2:
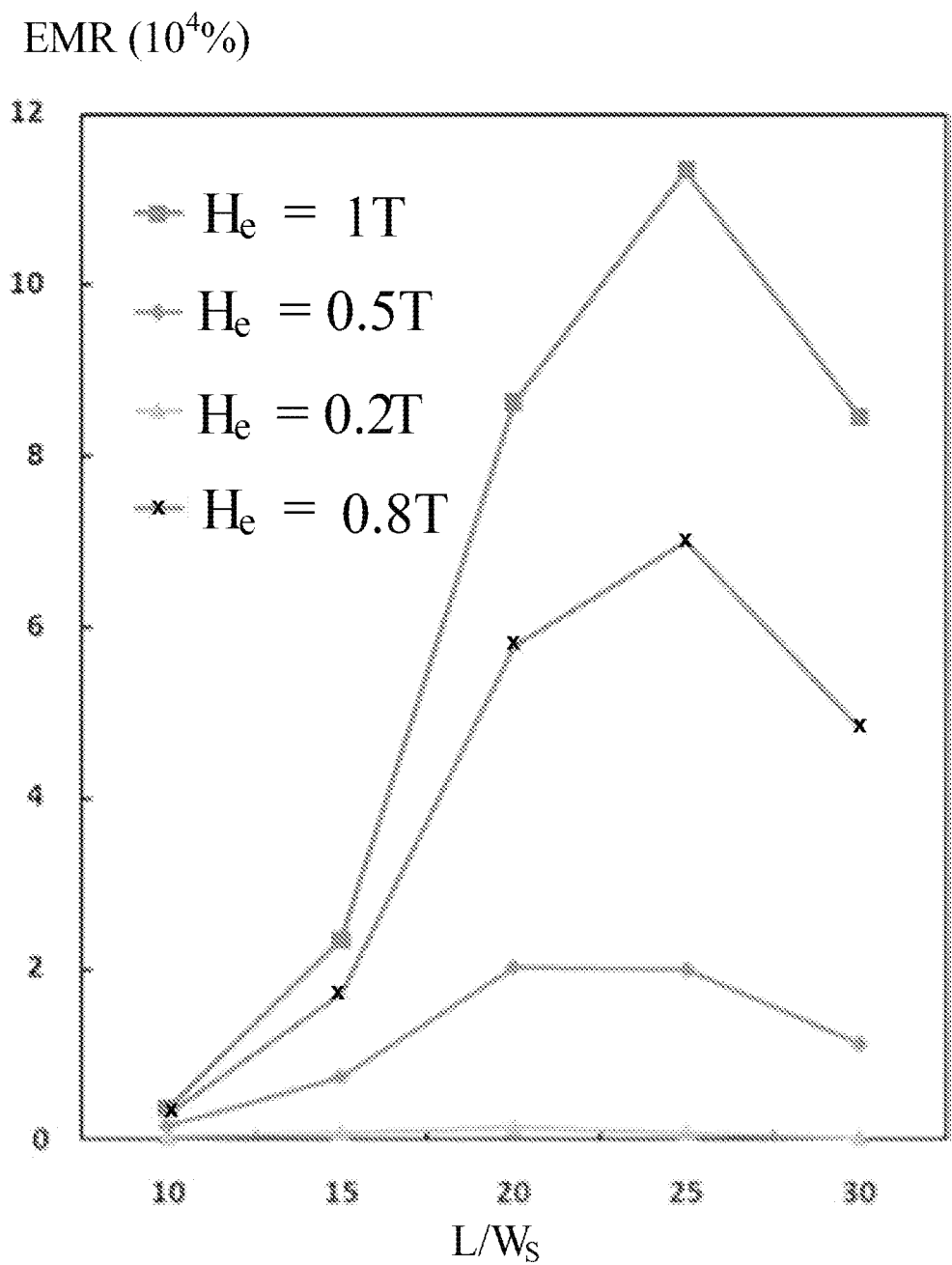
FIG. 2 plots the simulated EMR effect of a prior art EMR effect sensor as a function of the width of the sensor divided by the length of the semiconductor layer for four external magnetic fields.

Extraordinary magnetoresistance (EMR) effect sensors are disclosed. An embodiment of an EMR effect sensor 400A is depicted in top view in FIG. 4A. The EMR effect sensor may also be referred to as a Hall-bar type sensor. In some embodiments, EMR effect sensor 400A may include semiconductor layer 404. Semiconductor layer 404 may include indium antimonide (InSb), indium arsenide (InAs), gallium arsenide (GaAs), aluminum indium antimonide (AlInSb), aluminum indium arsenide (AlInAs), silicon (Si). The length 416 of semiconductor layer 104 may be approximately 50 µm (e.g., between 30-70, between 40-60, and/or 45-55 µm). The width 414 of semiconductor layer 404 may be 5 µm (e.g., between 3-7, between 4-6, and/or 4.5-5.5 µm). As discussed with respect to FIG. 2, the width 414 of semiconductor layer 404 may be selected for optimum sensitivity as a function of the ratio between the length 416 of the width 414 of the semiconductor layer In some embodiments, conductive layer 402 may be substantially coupled to the semiconductor layer 404. Conductive layer 402 may be a metal layer with a width 412. Moreover, conductive layer 404 may include gold (Au), copper (Cu), silver (Ag), and/or other like conductive materials. Conductive layer 402 may also have a length 416 of approximately 50 µm (e.g., between 30-70, between 40-60, and/or 45-55 µm). As shown in the depicted embodiment, the conductive layer may be substantially coupled to the semiconductor layers. Both layers may be in substantial contact.

In some embodiments, first voltage lead 408 may be coupled to semiconductor layer 404. As shown in the depicted embodiment, first voltage lead 408 may be arranged substantially along center 410 of EMR effect sensor 400A. First voltage lead 408 may be substantially coupled to semiconductor layer 404. In some embodiments, a second voltage lead 409 may be coupled to conductive layer 402. As shown in the depicted embodiment, second voltage lead 409 may also be arranged substantially along center 410 of EMR effect sensor 400A. Moreover, as shown in the depicted embodiment, the first and second voltage leads are located on opposite sides of EMR effect sensor 400A rather than being located on the same side of the sensor.

First voltage lead 408 and second voltage lead 409 may be configured to provide a voltage for measurement to a voltage measurement circuit (not shown). Moreover, voltage may be measured across the EMR sensor using first voltage lead 408 and second voltage lead 409. A voltage measurement circuit may include a voltmeter, a digital multimeter (DMM), or other analog or digital circuit configured to measure voltage across two leads. In some embodiments, first voltage lead 408 and second voltage lead 409 may include Au, Cu, Ag, and/or other electrically conductive material. First voltage lead 408 and second voltage lead 409 may include the same material and/or materials as conductive layer 402, but the leads may also include different materials. In some embodiments, second voltage lead 409 may be substantially fused to conductive layer 402. Moreover, second voltage lead 409 may be an extension of conductive layer 402.

In some embodiments, EMR effect sensor 400A may further include first current lead 406 and second current lead 407. First current lead 406 and second current lead 407 may be similarly configured to provide a current for measurement by a current measurement circuit. As shown in the depicted embodiment, first current lead 406 and second current lead 407 may be arranged substantially symmetrically around center 410. FIG. 4A and FIG. 4B illustrate two embodiments of arrangements of first current lead 406 and second current lead 407. As shown in FIG. 4B, first current lead 406 and second current lead 407 are arranged more closely to center 410 than in FIG. 4A. As shown in the depicted embodiment, first current lead 406 and second current lead 407 are both coupled to semiconductor layer 404.

In some embodiments, semiconductor layer 404 is n-doped. The doping of the semiconductor layer may involve adding a dopant to increase the charge carriers (e.g., electrons) within semiconductor layer 404. Doping the semiconductor layer may increase the mobility of the charger carriers within the semiconductor layer. For example, tellurium (Te) or phosphorous (Ph) may be used as dopants. In some embodiments, the semiconductor layer 404 includes multiple n-doped layers: a first n-doped layer, a second n-doped layer, and a third n-doped layer. For example, the first n-doped layer may include Te-doped n-type InSb (Al0.09In0.91Sb) with a thickness of approximately 2 μm (e.g., 1-3 or 2.5-3.5 μm). The second n-doped layer may include Te-doped n-type InSb with a thickness of approximately 1.5 μm (e.g., 1-2 or 1.25-1.75 μm). The third n-doped layer may include InSb (Al0.09In0.91Sb) with a thickness of approximately 50 nm (e.g., between 30-70, between 40-60, and/or 45-55 μm). Moreover, in some embodiments, the third n-doped layer may be above the second n-doped layer, and the second n-doped layer may be above the third n-doped layer.

Figure 5:
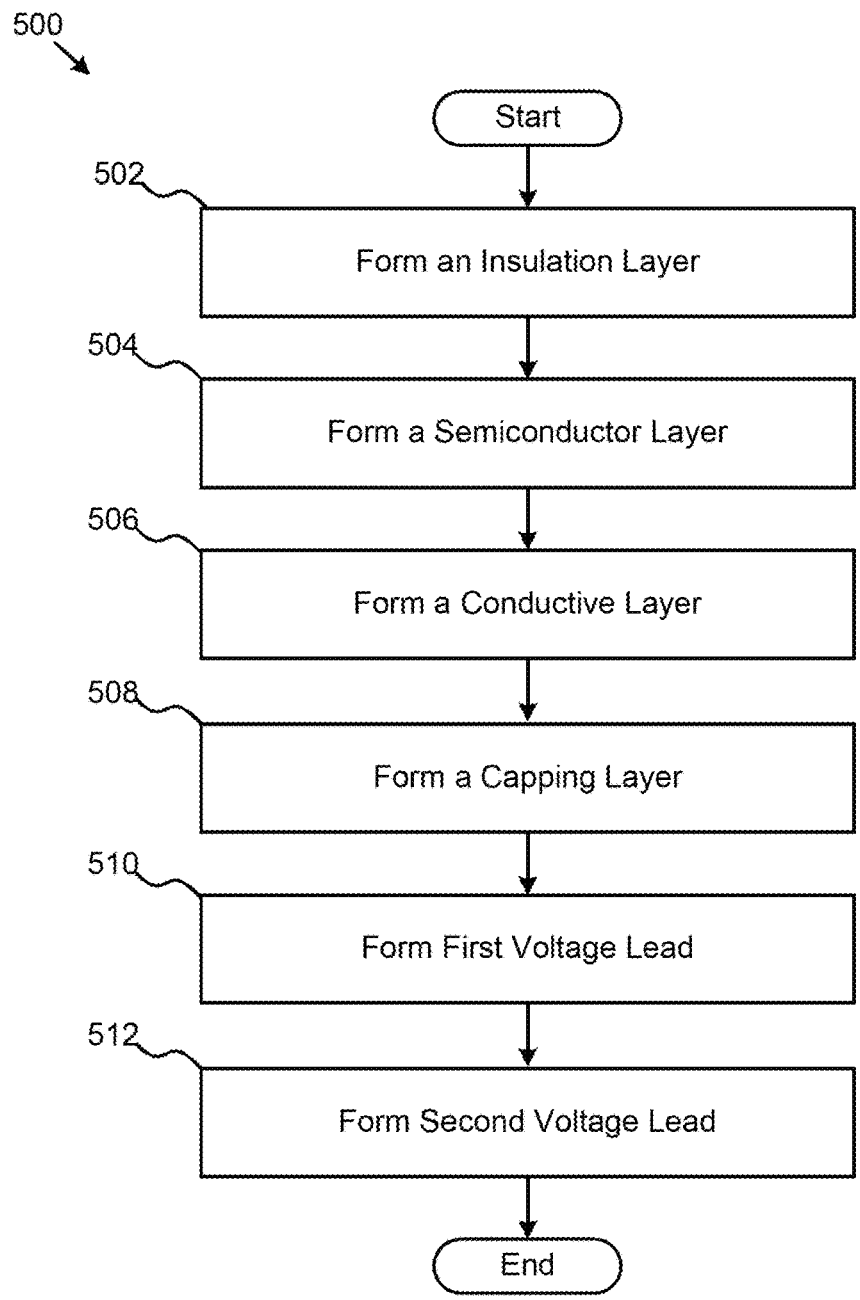
FIG. 5 is a flowchart illustrating an embodiment of a method for fabricating an EMR effect sensor.
Figure 6:
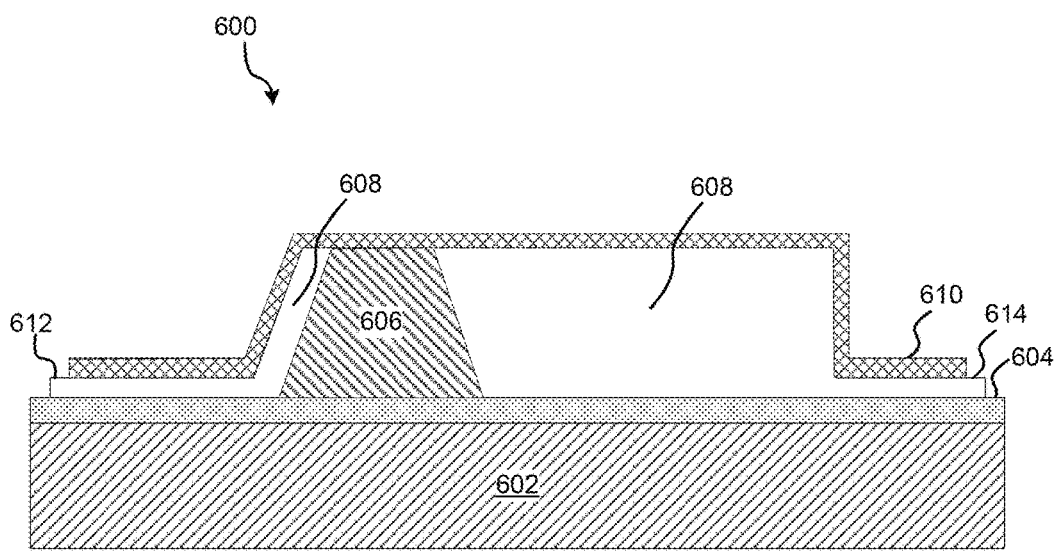
FIG. 6 illustrates another embodiment of the present EMR effect sensor.

FIG. 5 illustrates one embodiment of a method 500 for fabricating an embodiment of EMR effect sensor—such as for example the embodiment illustrated in cross-section in FIG. 6. In some embodiments, the method 500 may include forming 502 an insulation layer 604 on a substrate. For example, insulation layer 604 may include depositing a thin film $Al_2O_3$ or other insulating materials known in the art. Forming 502 the insulation layer 604 may include a chemical vapor deposition process (CVD), a physical vapor deposition process (PVD), atomic layer deposition process (ALD), or other like process known in the art. Substrate 602 may include GaAs or other semiconductors/insulators known in the art. In some embodiments a buffer layer (not shown) may be grown on top of the insulation layer. For example, the buffer layer (not shown) may include a thin film of un-doped semiconductor (e.g., 200 nm of In Sb). In some embodiments, the buffer layer may be grown with a vapor-phase epitaxy process. The insulator layer may act to stop the current flow into substrate. The buffer layer may be used to accommodate the different lattice constants of the substrate and the semiconductor layer, and thus, may be used as a strain relief layer between the substrate layer and the semiconductor layer.

In some embodiments, the method 500 may also include forming 504 a semiconductor layer 606. Forming 504 the semiconductor layer 606 may include forming a variety of materials such as for example, InSb, InAs, GaAs, AlInSb, AlInAs, and Si. In some embodiments, forming 504 the semiconductor layer 606 may include forming a n-doped semiconductor layer, and in some embodiments, forming 504 the semiconductor layer 606 may include forming a first n-doped layer, forming a second n-doped layer, and forming a third n-doped layer. For example, forming the first n-doped layer may include growing a 2 μm film of Te-doped n-type InSb (Al0.09In0.91Sb). Forming the second n-doped layer may include growing a 1.5 μm film of Te-doped n-type InSb. Forming the third n-doped layer may include forming a heavily doped n-type InSb (Al0.09In0.91Sb) film. Each of the n-doped layers may be formed using a metalorganic vapor phase epitaxy process.

In some embodiments, method 500 may also include forming 506 a conductive layer 608 on top of the semiconductor layer. For example, forming 506 the conductive layer 608 may include forming a metal layer such as Au, Cu, Ag, and/or other like conductive material. The conductive layer may be formed using a PVD, CVD, ALD, or like process known in the art. For example, a sputtering process may be used and may help provide electrical contact between the conductive layer and the semiconductor layer.

In some embodiments, method 500 may also include forming 508 a capping layer 610 on top of the semiconductor layer. The capping layer 610 may form a passivating layer on top of conducting layer 608. In some embodiments, forming 508 the capping layer may include depositing approximately 200 nm of $Si_3N_4$ and/or $Al_2O_3$.

In some embodiments, the method 500 may also include forming 510 a first voltage lead 612 and forming 512 a second voltage lead 614. The configuration of first voltage lead 612 and 614 are described in more detail with respect to FIG. 4. Forming 510 first voltage lead 612 and forming 512 second voltage lead 614 may include using reactive ion etching (RIE) to smooth each side of the structure 600, and diffuse conductive material (e.g., Au, Ag, and/or Cu) and make electrical contact with the conductive layer 608.

In some embodiments, the method 500 may further comprise forming a first current lead a second current lead (not shown). As discussed in more detail with regards to FIG. 4, the first current lead and second current both may be coupled to the semiconductor layer. First current lead and second current lead may be formed using the same processes used to form 510 first voltage lead 612.

Figure 7:
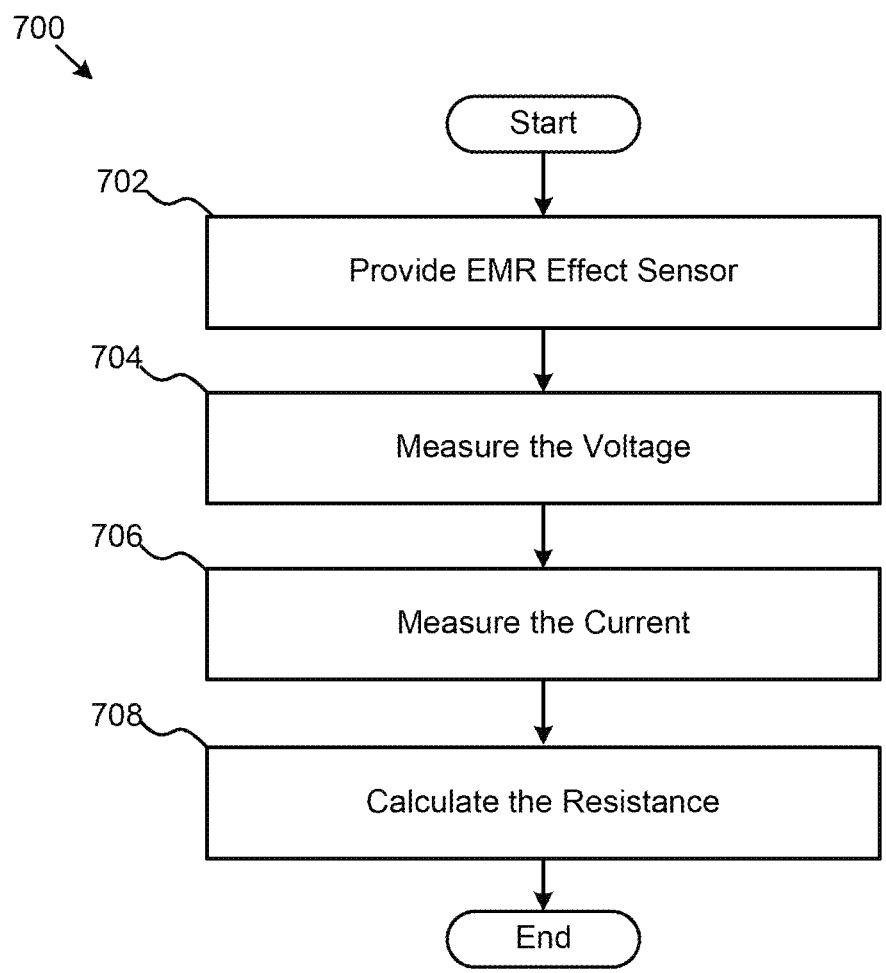
FIG. 7 is a flowchart illustrating an embodiment of a method for measuring the EMR effect using an embodiment of the present EMR effect sensor.

FIG. 7 illustrates a method 700 for detecting a magnetic field. In some embodiments, the method 700 includes providing 702 an EMR effect sensor. For example, an EMR effect sensor may include sensors 400A, 400B, and 600. Moreover the EMR effect sensor may include a semiconductor layer, a conductive layer, a first voltage lead, a second voltage lead, a first current lead, and a second current lead as discussed with regards to FIGS. 4A, 4B, and 6. In some embodiments, the method 700 may include measuring 704 the voltage across the first voltage lead and the second voltage lead. In some embodiments, the method 700 may include measuring 706 the current through the first current lead and the second current lead. Next, in some embodiments, the method 700 may include calculating resistance in response to the measured voltage and the measured current. For example, the resistance of the EMR effect sensor may be calculated using equation (2). Moreover, the EMR effect may be measured by calculating the change in resistance in the presence of a magnetic field using equation (1). Changes of the calculated resistance may indicate a change in the magnetic field.

Figure 8:
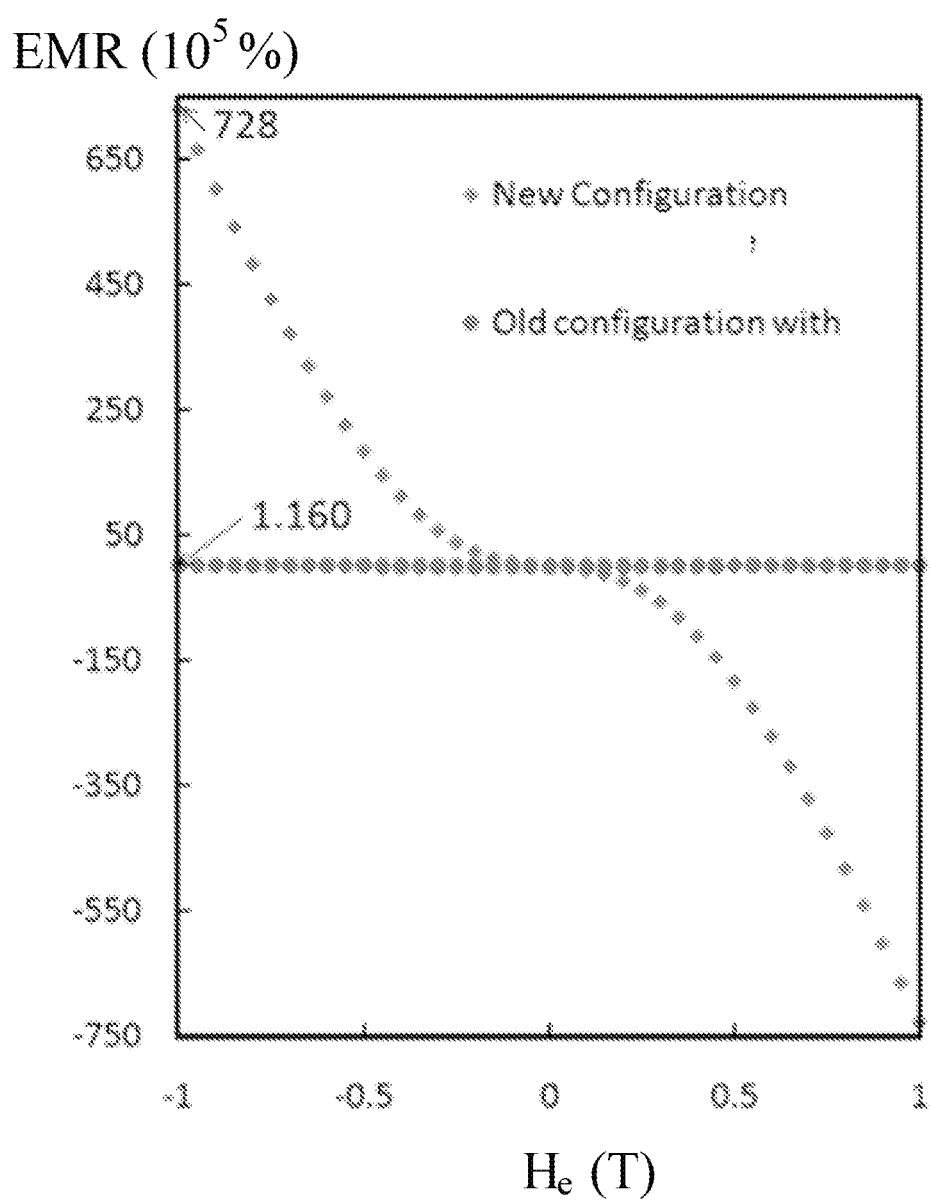
FIG. 8 compares the simulated EMR effect of an embodiment of the present EMR effect sensor and a prior art EMR sensor as a function of the external magnetic field.
Figure 9:
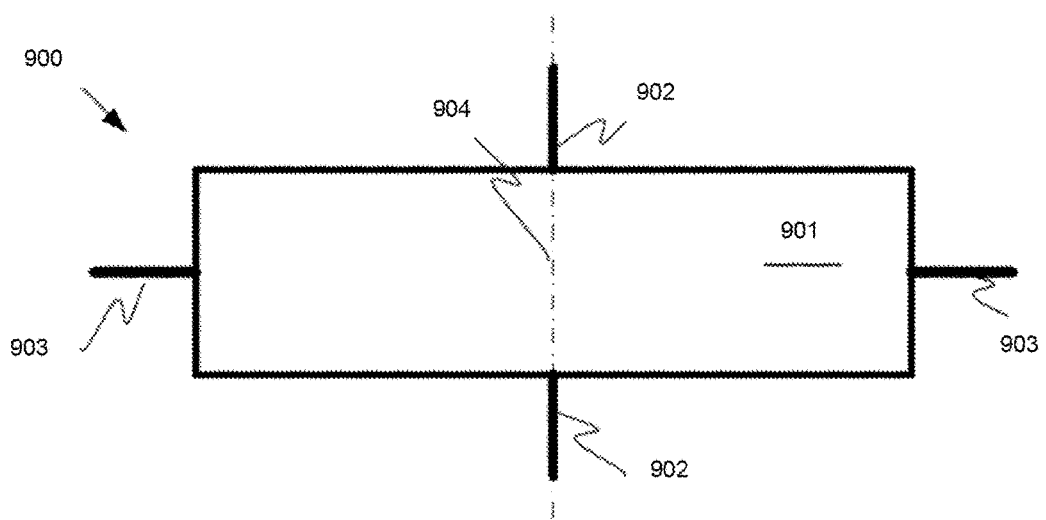
FIG. 9 illustrates a conventional four contacts Hall sensor with current leads and two voltage probes placed along the central line.

FIG. 8 illustrates the EMR effect of a claimed embodiment of an EMR effect sensor compared to a prior art. As shown, when compared to the claimed embodiment, the measured EMR effect of a prior art EMR effect sensor appears to be a straight line as a function of the magnetic field. As shown, the calculated EMR effect of the prior art sensor in the presence of a −1 T external magnetic field is $1.160 \times 10^5$%. The claimed EMR effect sensor had a calculated EMR effect of $728 \times 10^5$% for the same external magnetic field of −1 T. As shown, the claimed EMR effect sensors may have a several hundred times improvement in detecting the presence of a magnetic field when compared to the prior art.

Hall Effect Sensors

Figure 4:
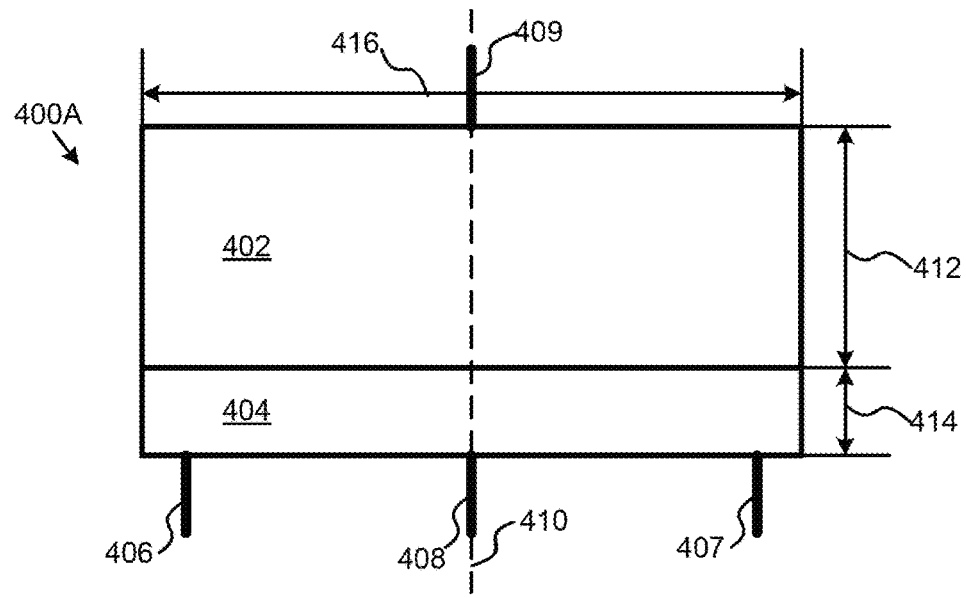
FIG. 4A illustrates an embodiment of the present EMR effect sensor.
FIG. 4B illustrates another embodiment of the present EMR effect sensor.
Figure 4:
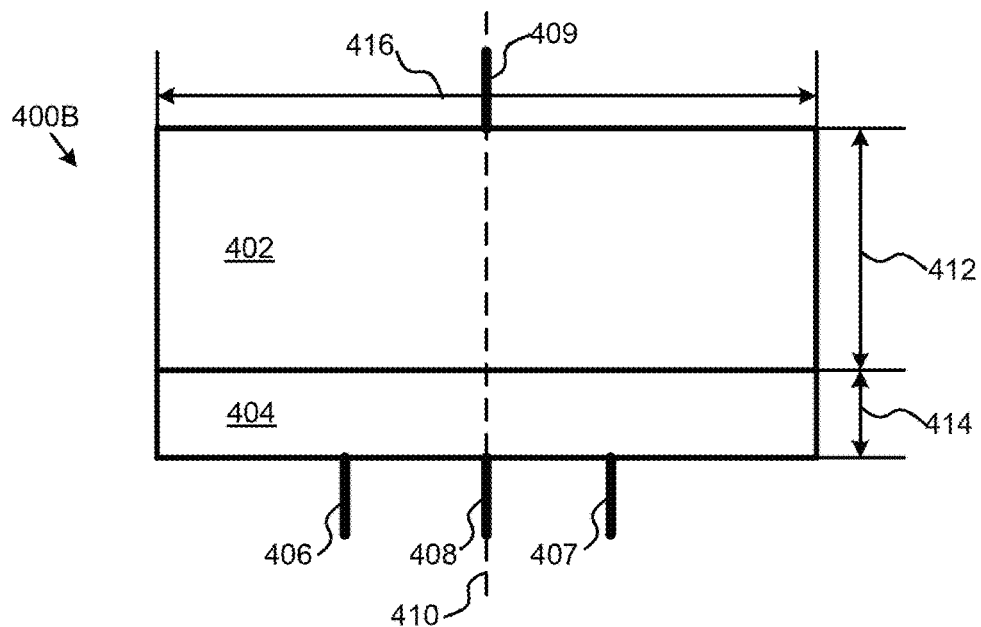

One of ordinary skill in the art will recognize that the same or similar structure as found in FIG. 4 may be used for a Hall sensor. One of ordinary skill in the art will also recognize various minor configuration changes, such as changes in material or orientation of the sensor with respect to the polarity of the magnetic field, that may enhance either the Hall effect or the EMR effect within the sensor. Thus, with only minor changes the sensor may be optimized for sensing EMR effect or Hall effect. For example, the Hall effect will typically be most pronounced when the magnetic field is applied perpendicular to the direction of current flow within the sensor. This is because the Hall effect typically involves the cross-product of the magnetic field and the current. On the other hand, one of ordinary skill in the art will recognize that the EMR effect can be enhanced by selection of materials. For example, a ferromagnetic metal materials, such as cobalt, nickel, and iron will produce a very large EMR effect relative to the Hall effect in the presence of an applied magnetic field. Paramagnetic materials, such as gold, copper, or aluminum may be used for sensing the Hall effect. One of ordinary skill in the art will recognize a variety of material combinations and magnetic field orientations that may be useful for optimizing sensing of either the Hall effect or the EMR effect.

Figure 10:
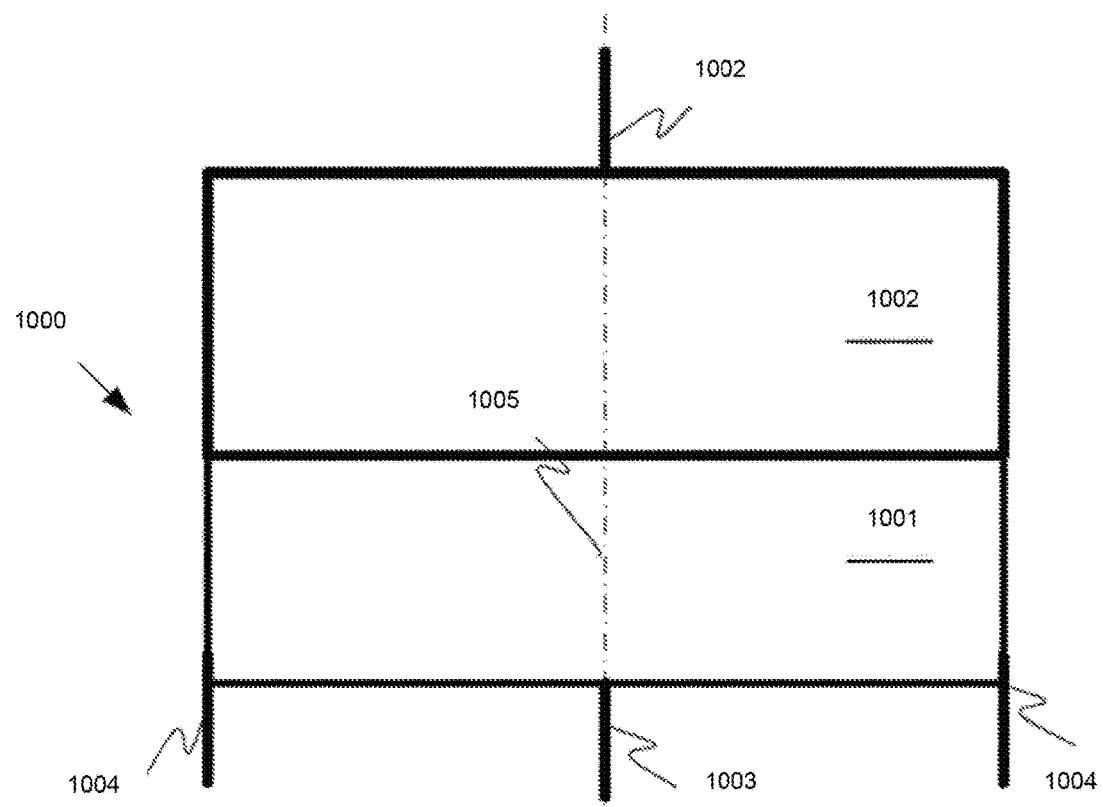
FIG. 10 illustrates a low-noise Hall sensor.

A low-noise Hall sensor is also disclosed. An embodiment of the Hall sensor 1000 is depicted in the top view in FIG. 10. One of ordinary skill in the art will appreciate the similarities between the Hall sensor of FIG. 10 and the EMR sensor of FIG. 4. The semiconductor layer 1001 is coupled with a metal shunt which acts as a voltage probe 1002. The second voltage probe 1003 is placed at the opposite side of the bar 1001 and along the central line 1005. Current leads 1004 are placed at the two ends of the semiconductor layer 1001 at the same side.

The semiconductor layer 1001 may be high mobility n-type III-V semiconductors. In some embodiments, the semiconductor layer may include n-type indium antimonide (InSb). In some embodiments, the semiconductor layer may include n-type indium arsenide (InAs). In some embodiments, the semiconductor layer may include n-type two-dimensional electron gas (2DEG) heterostructure, which is a high-mobility quantum well. The main type of 2DEG is formed of InAs/AlSb sandwich structure.

The shunt-like voltage probe 1002, the second voltage probe 1003, and two current leads are all metallic ohmic contacts. For n-type InAs and InSb, the metallic ohmic contact is formed with titanium (Ti)/platinum (Pt)/gold (Au) by e-beam evaporation or sputtering. For InAs/AlSb 2DEG heterostructure, the metallic contact is formed with palladium (Pd)/platinum (Pt)/gold (Au) by e-beam evaporation or sputtering. Both of these two metallic structures may undergo a post-annealing process to form the ohmic contact.

Figure 11:
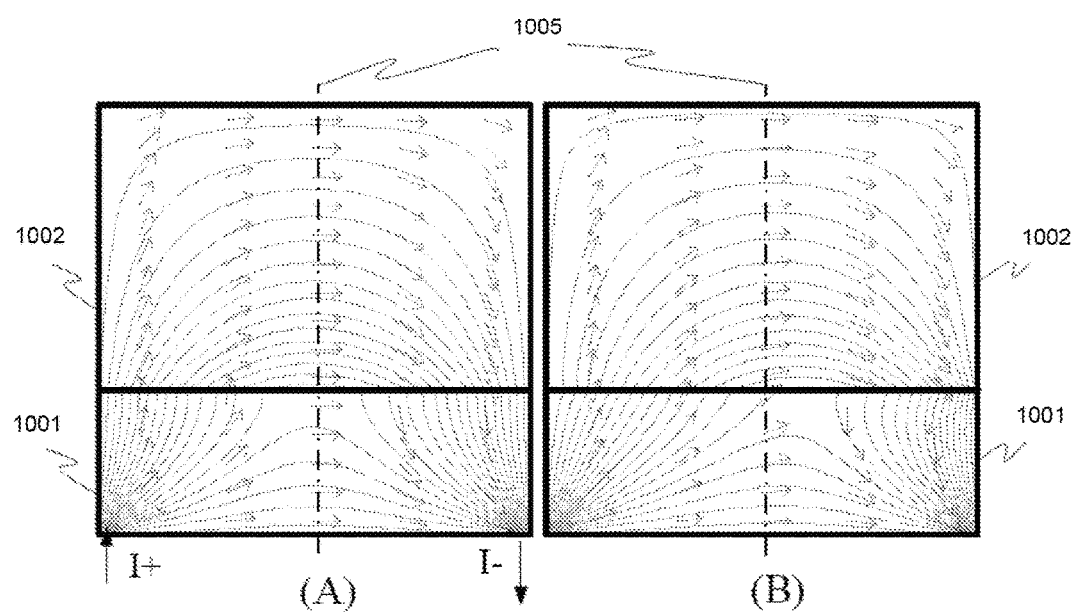
FIG. 11A illustrates the current path lines and electric field direction arrows in a low-noise Hall sensor in the presence of zero magnetic field.
FIG. 11B illustrates the current path lines and electric field direction arrows in a low-noise Hall sensor in the presence of an external magnetic field.

FIG. 11 illustrates the current path and electric field in the Hall effect sensor when no external magnetic field is applied. The vector diagram illustrating current flow is shown within the structure of the device to illustrate current flow with respect to the various features of the sensor, including the semiconductor/metal interface.

Figure 12:
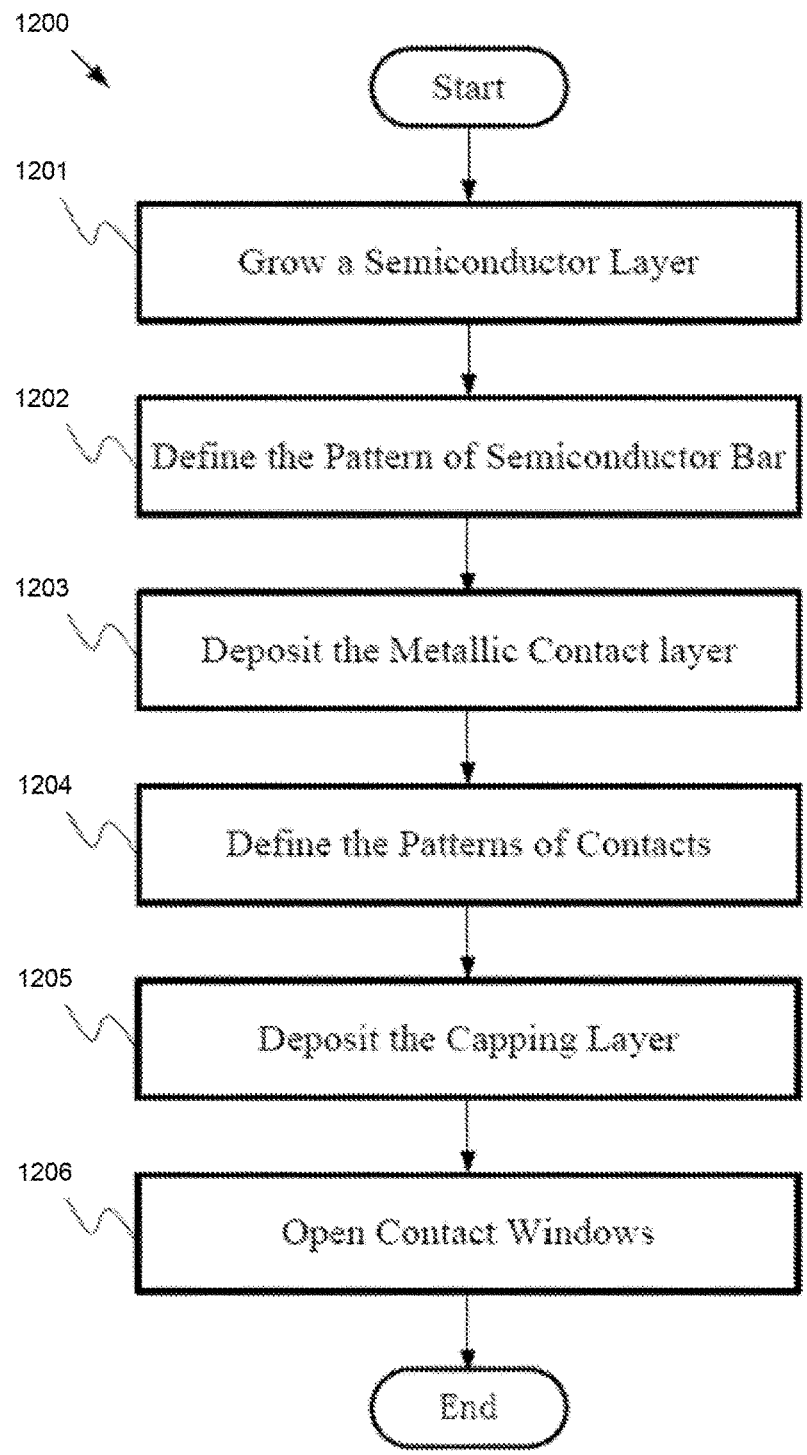
FIG. 12 is a flowchart illustrating an embodiment of a method for fabricating a low-noise Hall sensor.

FIG. 12 illustrates one embodiment of a method for forming a Hall effect sensor 1000. In one embodiment, the method 1200 starts by growing 1201 a semiconductor layer. For example the semiconductor layer may be silicon. Next, the method 1200 includes defining 1202 a patter on the semiconductor layer. The pattern may be used for forming the contact leads. In a particular embodiment, the pattern may be formed in photoresist. Next, the method 1200 includes depositing 1203 a metallic contact layer. The metallic contact layer may comprise the metallic leads. The patterns of the contacts may then be defined 1204, for example using a wet etch, dry etch or lift-off process. Next, a capping layer may be deposited 1205 over or around the sensor. Finally, contact windows may be opened 1206 in the capping layer allowing access to the metallic leads. One of ordinary skill in the art will recognize alternative methods for forming the sensor, including those described in FIG. 5.

Hall Effect Enhanced EMR Sensors

Figure 3:
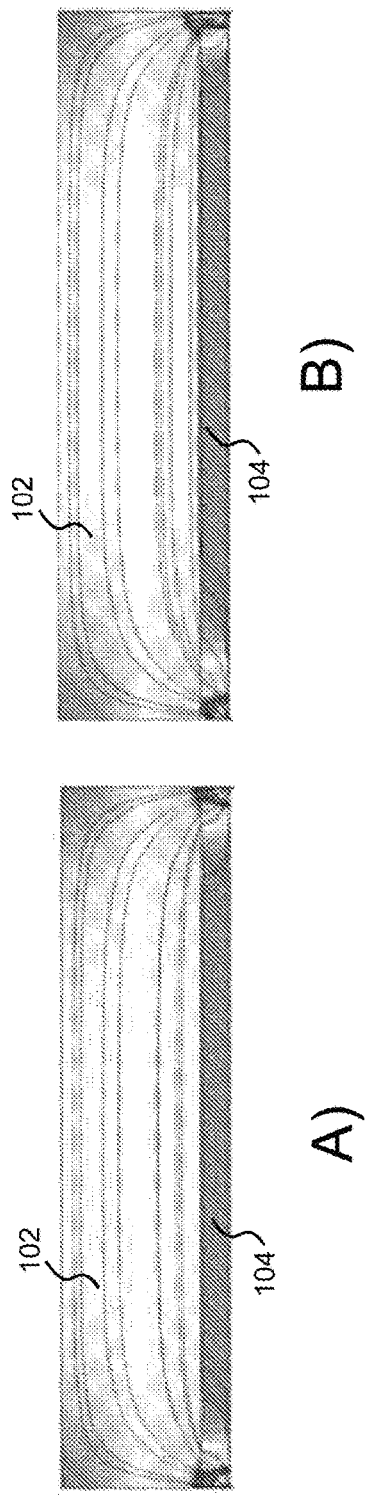
FIG. 3A illustrates the current density flux lines through an EMR effect sensor in the presence of zero external magnetic field.
FIG. 3B illustrates the current density flux lines through an EMR effect sensor in the presence of a magnetic field.

A strong magnetoresistance effect, the so-called extraordinary magnetoresistance (EMR), can be demonstrated to exist at room temperature in a certain kind of semiconductor/metal hybrid structure. The orbital motion of carriers in a perpendicularly applied external field causes a current deflection resulting in a redistribution of the current from the metal shunt 102 (FIGS. 3A and 3B) into the semiconductor layer 104 (FIGS. 3A and 3B), which is the main reason for the resistance increase. The principle of EMR sensing is based upon the change of the current path in the hybrid structure upon application of a magnetic field rather than the change of magnetoconductivity $\sigma$ of either the semiconductor or the metal. This effect can be utilized to implement sensors for the measurement of magnetic fields perpendicular to the device.

Figure 13A:
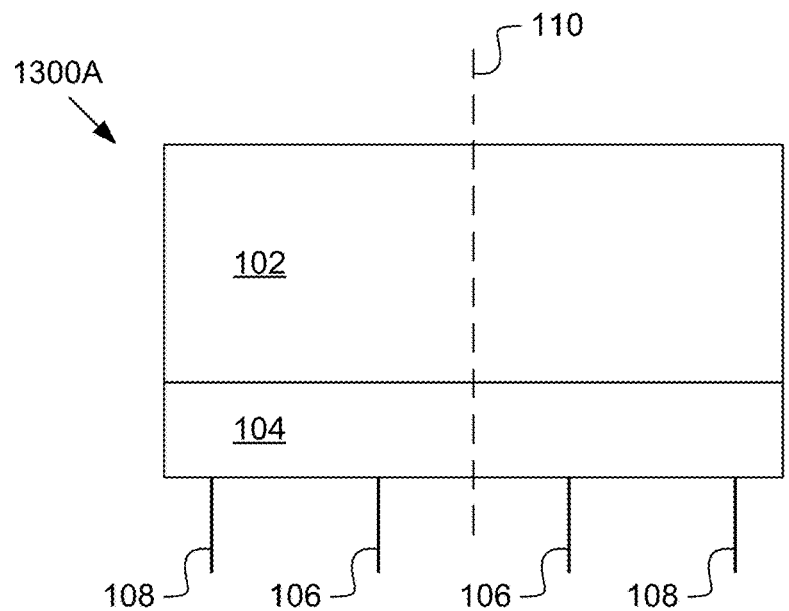
FIGS. 13A and 13B illustrate examples of EMR effect sensors with voltage and current leads in symmetrical and asymmetrical configurations, respectively, along one side of the sensor.
Figure 13B:
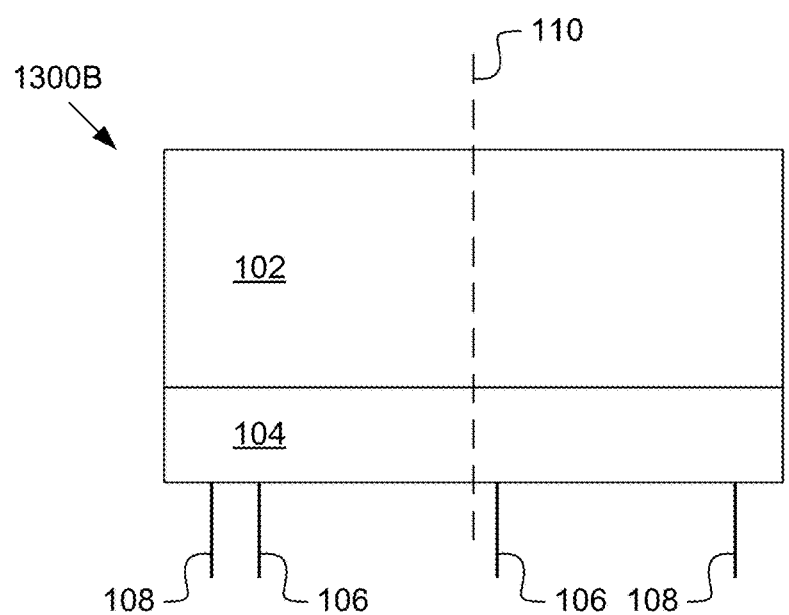

The EMR effect was examined in a macroscopic composite Van der Pauw disk made of a semiconductor disk with a concentric metallic circular inhomogeneity embedded, and four electrodes were used to apply current and measure voltage. Although this structure provided good results, its realization in mesoscopic and microscopic length scales was very difficult. Using bilinear transformation, a bar-type geometry as illustrated in FIGS. 4 and 11, which includes a semiconductor bar shunted by a metal stack on one side, can be derived, that shows a similar EMR effect while being simpler in terms of fabrication. The EMR effect strongly depends on the geometry of the device and the placement of the electrical contacts. With respect to the placement of the electrodes, two major kinds of configurations can be distinguished: a symmetric configuration 1300A as shown in FIG. 13A, where the placement of electrodes 106 and 108 are symmetric to the central axis 110 of the bar-type device or an asymmetric configuration 1300B where the electrodes 106 and 108 are not symmetrically located about the central axis 110 as illustrated in the example of FIG. 13B.

Figure 14A:
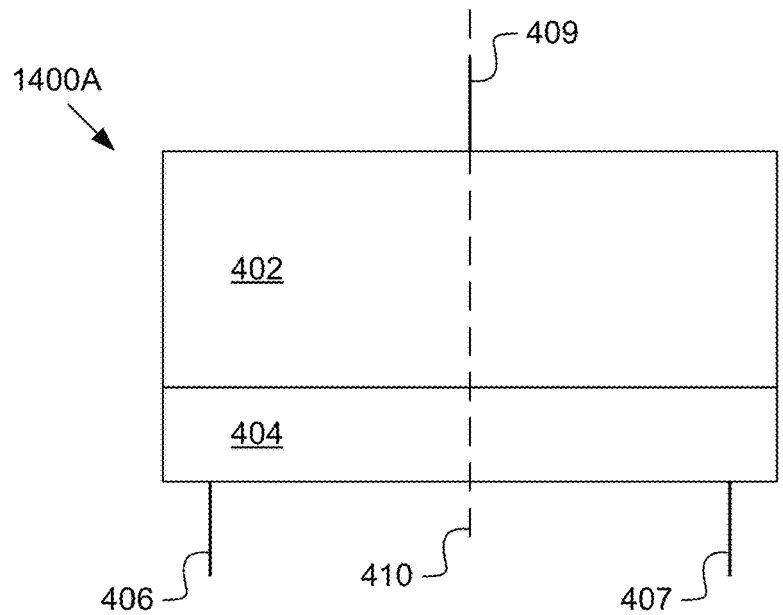
FIG. 14A illustrates an example of an enhanced EMR effect sensor.

At high fields of about 0.1 T, an outstanding sensitivity can be achieved with symmetric EMR sensors 1300A made of group III-V materials. For example, a two-contact EMR sensor may exhibit a strong sensitivity of 85 $\Omega$/T at 0.1 T, which is comparable to that of GMR sensors used in recording applications. Since the symmetric EMR sensor 1300A has a parabolic magnetoresistance curve, it suffers from a weak low-field sensitivity that may limit the applicability of the EMR sensor 1300A and hinder commercialization. Enhanced low-field sensitivity can be obtained with an asymmetric electrode arrangement. Referring to FIG. 14A, shown is a graphical representation of an example of an enhanced EMR sensor 1400A with a three-contact configuration, which combines the EMR effect and the Hall effect. The Hall effect has a linear response to a magnetic field change producing considerable sensitivity in the low-field region. Due to this, the three-contact sensor 1400A exhibits significantly enhanced low-field sensitivity.

In the example of FIG. 14A, a voltage lead 409 is coupled to the conductive layer 402 opposite the semiconductor layer 404, a first current lead 406 is coupled to a second side of the semiconductor layer, and a second current lead 407 is coupled to the second side of the semiconductor layer. Current flowing between the first and second current leads 406 and 407 may be measured at the first current lead 406 and/or the second current lead 407. Voltage may be measured between voltage lead 409 and the first current lead 406 or between voltage lead 409 and the second current lead 407.

The current lead used for voltage measurement may be referred to as a common lead. In some implementations, another voltage lead coupled to the second side of the semiconductor layer between the center 410 of the sensor 1400 and the second current lead 407. Voltage may be measured between voltage lead 409 and the other voltage lead. The other voltage lead may be located for the desired sensing taking into account the EMR effect and Hall effect.

Figure 14B:
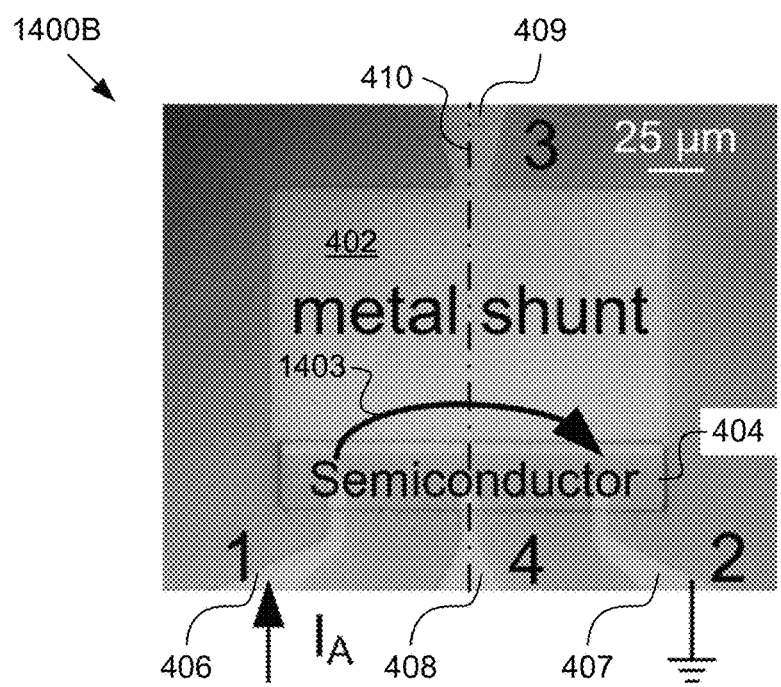
FIG. 14B is an optical microscope image of a fabricated example of an EMR sensor.

Referring next to FIG. 14B, shown is an optical microscope image of a fabricated sensor 1400B. A semiconductor sample was deposited by solid-source molecular beam epitaxy on a semi-insulating GaAs substrate with the following structure: Substrate/In$_x$Ga$_{1-x}$As metamorphic buffer (1 μm)/ InAs stabilizing buffer (0.2 μm)/Si-doped InAs active layer (1.5 μm, n=10$^{16}$ cm$^{-3}$). The metamorphic buffer was inserted between GaAs and InAs to accommodate the large lattice mismatch between them. A moderate mobility μ of 0.816 m$^2$/V·s and carrier density n$_s$ of 5.6×10$^{16}$ cm$^{-3}$ at 300K has been observed in an unpatterned sample with the standard van der Pauw technique.

After growth, the semiconductor 404 was patterned into a rectangular mesa by photolithography followed by wet etching in citric acid solution exploiting the semi-insulating GaAs as an etch stop. The metal shunt 402 and electrodes 406, 407, and 409 were metallized with a Ti (10 nm)/Au (150 nm) stack by magnetron sputtering. A low contact resistivity of about 10$^{-7}$ Ωcm$^2$ was realized after a rapid thermal annealing process at 250° C.

In the embodiment of FIG. 14B, the current electrodes (or leads) 406 and 407 were symmetrically placed at the two ends of the semiconductor bar (or layer) 404 with a separation of 50 μm from the central line. At the central line, the voltage electrode 409 was connected to the metal shunt (or conductive layer) 402 while electrode 408 was connected to the semiconductor bar 404. The output voltage signal was measured between electrodes (or leads) 409 and 407. Electrode 407 may also be referred to as a common lead for both current and voltage measurement. In the example of FIG. 14B, electrode 407 was grounded. Electrode 408 was added to the sensor only to measure a reference signal for the sake of comparison. The distances between each electrode 406, 407, and 408 on the semiconductor bar and the edge of the metal shunt were 10 μm.

The sensor 1400B was wire bonded to a printed circuit board and measurements and characterizations were carried out using a physical property measurement system. A homogenous external field B ranging from −1 T to 1 T was applied in a perpendicular direction to the sensor 1400B in steps of 0.01 T. The external magnetic field was applied perpendicularly to the illustration plane of FIG. 14B. A constant current of 100 μA was applied to the device via electrodes 406 and 407 throughout the measurements. Arrow 1403 illustrates the direction of current flow. The current transport in the hybrid structure is governed by Ohm's Law j=σ·E, where E is the electric field and σ is the conductivity matrix, which is expressed as $$\sigma = \frac{\sigma_0}{1+\beta^2}\begin{bmatrix} 1 & -\beta \\ \beta & 1 \end{bmatrix}, \quad (6)$$

where β=μ·H and σ$_0$=μ·n·e is the Drude conductivity without magnetic field, μ is the mobility of the carriers, n is the carrier density, and e is the electric charge. With a high mobility semiconductor sample, a strong EMR effect can be expected. In steady state, the electrostatic potential φ(x,y) is described by ∇·[σ·∇φ(x,y)]=0. The output sensitivity δ is defined as the rate of change of the output voltage V=φ(i)−φ(j), where φ(i) and φ(j) are the potentials at electrode i and j, respectively, (where i and j are 1, 2, 3 or 4 as indicated in FIG. 14B) with respect to the magnetic field. The output voltage between electrodes 409 and 407 of the sensor 1400B can be expressed as $V_{3-2}=V_{3-4}+V_{4-2}$, where $V_{3-4}$ is the Hall voltage of the hybrid structure and $V_{4-2}$ is the voltage arising from the asymmetric magnetoresistance $R_{4-2}$. The sensitivity of the sensor 1400B is calculated as $\delta_{3-2}=\partial V_{3-2}/\partial B=\delta_{3-4}+\delta_{4-2}$. Thus, in addition to a component $\delta_{4-2}$ resulting from the asymmetric EMR effect of common sensors, the output sensitivity of this device is enhanced by a component $\delta_{3-4}$, which is caused by the Hall effect.

Figure 15:
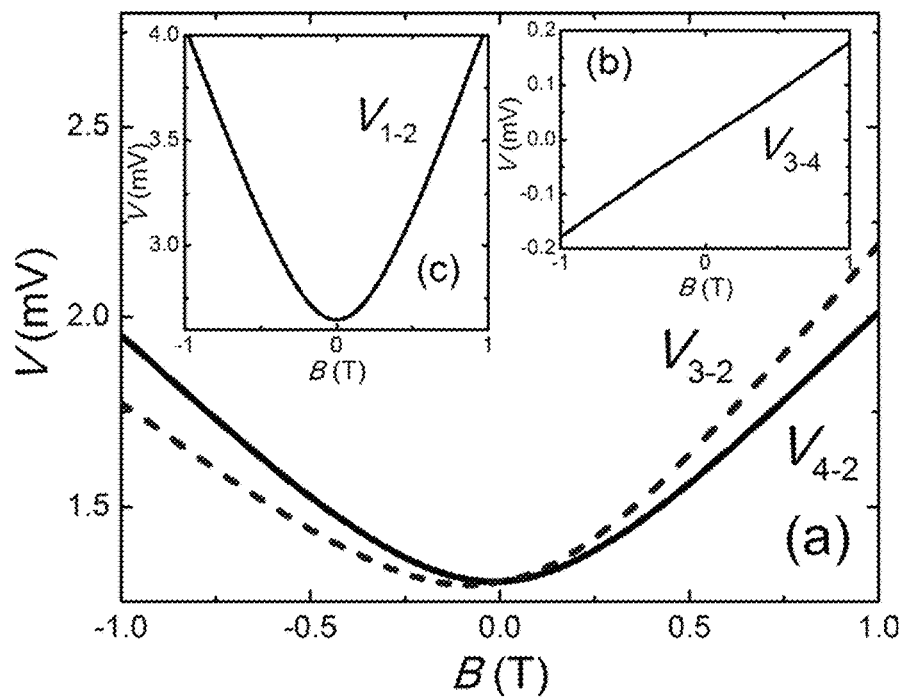
FIGS. 15(a), 15(b), and 15(c) are plots of voltages between different electrodes of the EMR sensor of FIG. 14B as a function of the homogenous magnetic field applied to the EMR sensor.

Referring now to FIG. 15, shown are the voltages $V_{i-j}$ measured between different electrodes as a function of the magnetic field B. The symmetric EMR voltage $V_{1-2}$ of $R_{1-2}$ was also measured for comparison. In the magnetic field range of ±0.25 T, the output of the symmetric EMR $V_{1-2}$ is approximately parabolic while the Hall voltage $V_{3-4}$ has a linear behavior as shown in FIG. 15(c). Asymmetric V vs. B curves were observed for both asymmetric EMR voltages $V_{4-2}$ and $V_{3-2}$ as shown in FIG. 15(a), which represents the output of the three-contact geometry. The difference between them, $V_{3-2}-V_{4-2}$, is equivalent to the Hall voltage $V_{3-4}$ as shown in FIG. 15(b), which was expected.

Figure 16:
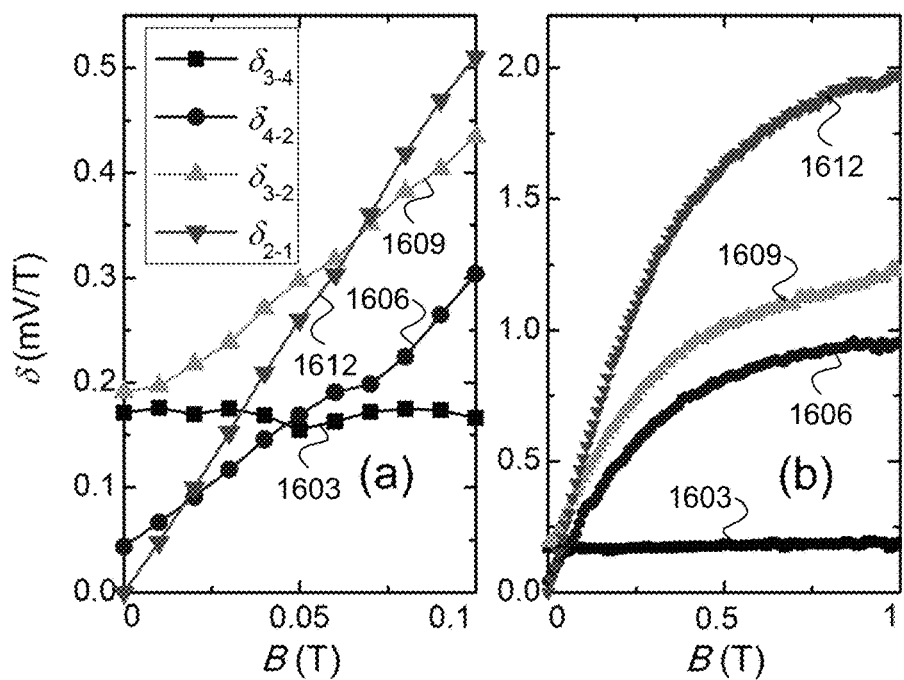
FIGS. 16(a) and 16(b) are plots of sensitivity of the EMR sensor of FIG. 14B as a function of magnetic field in (a) a low-field region and (b) a high-field region of the EMR sensor.

Moving to FIG. 16, shown are the sensitivities as a function of the magnetic field. FIG. 16(a) illustrates sensitivity versus magnetic field in a low-field region and FIG. 16(b) illustrates sensitivity versus magnetic field in a high-field region with different electrode configurations. Curve 1603 corresponds to $\delta_{3-4}$, curve 1606 corresponds to $\delta_{4-2}$, curve 1609 corresponds to $\delta_{3-2}$, and curve 1612 corresponds to $\delta_{2-1}$. The linear Hall response has a constant sensitivity $\delta_{3-4}$ of about 0.16 mV/T, while the outputs of the EMR effect become more sensitive as the field gets stronger. The asymmetric EMR sensitivity $\delta_{1-2}$ is slightly increased compared to the symmetric one $\delta_{1-2}$ in the range of 0 T–0.015 T. The highest sensitivity at zero field is obtained between electrodes 409 and 407 with $\delta_{3-2}$=0.19 mV/T, which is equivalent to the one of the symmetric EMR $\delta_{1-2}$ with a bias of 0.037 T and to the one of the asymmetric EMR $\delta_{4-2}$ at 0.061 T. At B=0.01 T, which is a typical working range for low field applications like magnetic beads detection, $\delta_{3-2}$ is as high as 0.2 mV/T compared to $\delta_{1-2}$=0.067 mV/T and $\delta_{1-2}$=0.048 mV/T. At the very high field regime, the sensor is still extremely sensitive though its performance is not quite as good as the one of a symmetric EMR device.

Thus, enhanced EMR sensor 1400 with a three-contact geometry, which combines the Hall effect and EMR effect, was fabricated and characterized. The enhanced EMR sensor 1400 shows a significant enhancement of the low-field output sensitivity. A value of 0.2 mV/T at 0.01 T has been measured, which is 5 times larger than that in a conventional symmetric EMR sensor 100. In order to achieve a similar sensitivity, the conventional EMR sensor 100 needs an external bias field of at least 0.03 T. An even higher sensitivity value can be expected in an enhanced EMR sensor 1400 made of a semiconductor epilayer with higher mobility and with an optimized geometry that takes into account the EMR and Hall effect. These results extend the applicability of the EMR sensor 1400 into the low field region while maintaining an exceptional performance in the high field region.

A magnetic field may be detected with an enhanced EMR sensor 1400 using, e.g., the method of FIG. 7. In some embodiments, an enhanced EMR sensor 1400 is provided in 702. The voltage between the voltage lead 409 and one of the leads 406, 407, or 408 connected to the semiconductor layer 404 may be measured in 704. The current flowing between leads 406 and 407 may be measured in 706. A resistance may then be calculated in 708 based upon the measured voltage and the measured current. For example, the resistance of the EMR effect sensor may be calculated using equation (2). Moreover, the EMR effect may be measured by calculating the change in resistance in the presence of a magnetic field using equation (1). Changes of the calculated resistance may indicate a change in the magnetic field.

In some implementations, the enhanced EMR sensor 1400 can be extended into the nano-scale regime to obtain a high spatial resolution, which is of interest for applications like reading heads. It should be noted that, as the device size is reduced to a value smaller than the mean free path, ballistic transport phenomena may become more relevant having an impact on the device performance. The EMR effect still persists in such a case. However, the EMR ratio is expected to be smaller than in case of the diffusive transport regime.

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

The apparatus disclosed and claimed herein can be made and executed without undue experimentation in light of the present disclosure. While the apparatus of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus or components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A magnetic sensor for measuring a magnetic field, the magnetic sensor comprising:
    a semiconductor layer having a first side and a second side, wherein the second side of the semiconductor layer is opposite to the first side of the semiconductor layer;
    a conductive layer having a first side and a second side, wherein the second side of the conductive layer is opposite to the first side of the conductive layer and the second side is physically covering the first side of the semiconductor layer; and
    a three-contact configuration that includes only:
    a first current electrode physically coupled to the second side of the semiconductor layer;
    a second current electrode physically coupled to the second side of the semiconductor layer, the first current electrode configured to provide a current flowing between the first and second current electrodes for measurement by a current measurement circuit; and
    a voltage electrode physically coupled to the first side of the conductive layer, the voltage electrode being configured to provide a voltage across the semiconductor layer and the conductive layer for measurement by a voltage measurement circuit, where the voltage is measured between the voltage electrode and the second current electrode for determining the magnetic field,
    wherein no other electrode, except the first and second current electrodes and the voltage electrode, is connected to the semiconductor layer or the conductive layer.

2. The sensor of claim 1, wherein the conductive layer comprises a material selected from the group consisting of gold (Au), copper (Cu), silver (Ag), and titanium (Ti).

3. The sensor of claim 1, wherein the semiconductor layer comprises a material selected from the group consisting of indium arsenide (InAs), aluminum indium antimonide (AlInSb), and aluminum indium antimonide (AlInSb).

4. The sensor of claim 1, where the semiconductor layer is n-doped.

5. The sensor of claim 1, where the semiconductor layer comprises a plurality of n-doped layers.

6. The sensor of claim 5, where the plurality of n-doped layers comprises a first n-doped layer, a second n-doped layer formed upon the first n-doped layer, and a third n-doped layer formed upon second n-doped layer.

7. The sensor of claim 1, where the semiconductor layer comprises a n-type high mobility two-dimensional electron gas (2DEG) heterostructure.

8. The sensor of claim 1, wherein the first and second current electrodes are coupled to the semiconductor layer at opposing edges of the second side of the semiconductor layer.

9. The sensor of claim 1, wherein the first and second current electrodes are asymmetrically located on the second side of the semiconductor layer about a center of the sensor.

10. The sensor of claim 1, wherein the sensor is an extraordinary magnetoresistance (EMR) sensor.

11. The sensor of claim 1, further comprising the voltage measurement circuit coupled between the voltage electrode and the second current electrode.

12. The sensor of claim 11, further comprising the current measurement circuit coupled between the first and second current electrodes.

13. The sensor of claim 1, wherein the voltage electrode is coupled at a center line of the conductive layer opposite the semiconductor layer.

14. A magnetic sensor for measuring a magnetic field, the magnetic sensor comprising:
    a substrate;
    a semiconductor layer formed over the substrate;
    a conductive layer formed on a first side of the semiconductor layer, the conductive layer shunting the semiconductor layer;
    a first current electrode connected to a second side of the semiconductor layer, the second side being opposite to the first side;
    a second current electrode connected to the second side of the semiconductor layer; and
    a voltage electrode coupled to a first side of the conductive layer, which is opposite to the first side of the semiconductor layer, wherein there are no other electrodes connected to the conductive layer or the semiconductor layer except the first and second current electrodes and the voltage electrode, and wherein the first and second current electrodes are used to measure a current through the magnetic sensor, the second current electrode and the voltage electrode are used to measure a voltage across the semiconductor layer and the conductor layer, and the current and the voltage are used to measure the magnetic field.

15. The sensor of claim 14, wherein the voltage electrode is coupled at a center line of the conductive layer.

16. The sensor of claim 14, where the semiconductor layer is n-doped.

17. The sensor of claim 14, where the semiconductor layer comprises a plurality of n-doped layers.

* * * * *